United States Patent
Kim et al.

(10) Patent No.: US 9,153,450 B2
(45) Date of Patent: Oct. 6, 2015

(54) METHOD FOR MANUFACTURING GALLIUM NITRIDE WAFER

(71) Applicant: LG Siltron, Inc., Gyeongsangbuk-do (KR)

(72) Inventors: Yong-Jin Kim, Gyeongbuk (KR); Dong-Kun Lee, Gyeongbuk (KR); Doo-Soo Kim, Gyeongbuk (KR); Ho-Jun Lee, Gyeongbuk (KR); Kye-Jin Lee, Gyeongbuk (KR)

(73) Assignee: LG Siltron Inc., Gyrongbuk (KR)

(*) Notice: Subject to any disclaimer, the term of this patent is extended or adjusted under 35 U.S.C. 154(b) by 174 days.

(21) Appl. No.: 13/714,240

(22) Filed: Dec. 13, 2012

(65) Prior Publication Data

US 2013/0178050 A1    Jul. 11, 2013

Related U.S. Application Data

(62) Division of application No. 13/019,146, filed on Feb. 1, 2011, now Pat. No. 8,354,289.

(30) Foreign Application Priority Data

Feb. 4, 2010 (KR) .......................... 10-2010-0010319
Feb. 23, 2010 (KR) .......................... 10-2010-0016034

(51) Int. Cl.
*H01L 21/302* (2006.01)
*C30B 25/18* (2006.01)
(Continued)

(52) U.S. Cl.
CPC ............ *H01L 21/302* (2013.01); *C30B 25/186* (2013.01); *C30B 29/406* (2013.01); *H01L 21/0237* (2013.01); *H01L 21/0254* (2013.01); *H01L 21/02458* (2013.01); *H01L 21/02488* (2013.01); *H01L 21/02494* (2013.01);
(Continued)

(58) Field of Classification Search
CPC .................. H01L 21/02664; H01L 21/02494; H01L 21/02458; H01L 21/0254; H01L 21/302
USPC ............ 438/22, 39, 41–42, 44; 257/E33.001, 257/E33.005–E33.006
See application file for complete search history.

(56) References Cited

U.S. PATENT DOCUMENTS

| 6,576,533 B2 | 6/2003 | Tomiya et al. |
| 7,101,444 B2 | 9/2006 | Shchukin et al. |

(Continued)

FOREIGN PATENT DOCUMENTS

| JP | 2005-159207 | 6/2005 |
| JP | 2012-508686 | 4/2012 |

(Continued)

OTHER PUBLICATIONS

Dadgar et al., "MOVPE growth of GaN on Si(111) substrates", Journal of Crystal Growth (2003): pp. 556-562.*

(Continued)

*Primary Examiner* — Michele Fan
(74) *Attorney, Agent, or Firm* — Lewis Roca Rothgerber LLP

(57) ABSTRACT

A method for manufacturing a gallium nitride (GaN) wafer is provided. In the method for manufacturing the GaN wafer according to an embodiment, an etch stop layer is formed on a substrate, and a first GaN layer is formed on the etch stop layer. A portion of the first GaN layer is etched with a silane gas, and a second GaN layer is formed on the etched first GaN layer. A third GaN layer is formed on the second GaN layer.

9 Claims, 3 Drawing Sheets

(51) Int. Cl.
 *C30B 29/40* (2006.01)
 *H01L 21/02* (2006.01)
(52) U.S. Cl.
 CPC .... *H01L21/02502* (2013.01); *H01L 21/02658* (2013.01); *H01L 21/02664* (2013.01)

(56) References Cited

U.S. PATENT DOCUMENTS

| | | | |
|---|---|---|---|
| 7,399,684 | B2 | 7/2008 | Roycroft et al. |
| 8,354,289 | B2 | 1/2013 | Kim et al. |
| 2002/0069817 | A1 | 6/2002 | Mishra et al. |
| 2002/0123166 | A1 | 9/2002 | Hasegawa et al. |
| 2003/0012925 | A1* | 1/2003 | Gorrell ............ 428/137 |
| 2003/0211662 | A1 | 11/2003 | Yamazaki et al. |
| 2005/0242364 | A1 | 11/2005 | Moustakas et al. |
| 2007/0259504 | A1 | 11/2007 | Bour et al. |
| 2010/0072576 | A1 | 3/2010 | Arena |
| 2010/0124814 | A1* | 5/2010 | Arena ............ 438/504 |
| 2010/0244197 | A1 | 9/2010 | Arena et al. |

FOREIGN PATENT DOCUMENTS

| | | |
|---|---|---|
| KR | 10-2001-0046863 | 6/2001 |
| KR | 10-2007-0031249 | 3/2007 |
| KR | 10-0695117 | 3/2007 |
| KR | 10-0818452 | 3/2008 |
| KR | 10-2009-0065860 | 6/2009 |
| TW | 541577 | 7/2003 |
| WO | WO 2010/056952 | 5/2010 |

OTHER PUBLICATIONS

Datta et al., "Reduction of Threading Dislocations in GaN grown on 'c' plane sapppire by Movpe", Materials Research Society (2005): pp. 1-6.*

Datta et al., "Reduction of Threading Dislocation Density using in-situ SiNX interlayers" (2005): pp. 59-62.*

Haffouz et al., "The effect of si/N treatment of nitridated sapphire surface on the growth mode of GaN low-pressure metaloranic vapor phase epitaxy", Applied Physics Letters, 73, 9 (1998): pp. 1278-1280.*

Hageman et al., "High Quality GaN Layers on Si(111) Substrate: AIN Buffer Layer Optimisation and Insertion of a SiN Intermediate Layer", Phys. Stat. Sol., 188, 2 (2001): pp. 523-526.*

Krost et al., "GaN-Based Devices on Si", Phys. Stat. Sol, 194, 2 (2002): pp. 361-375.*

Chakraborty et al., "Defect reduction in nonpolar a-plane GaN films using in situ SiNx nanomask" Applied physics Letters, 89 (2006): pp. 041903-1 to 041903-3.*

Pakula et al., "Reduction of dislocation density in heteroepitaxial GaN: role of SiH4 treatment" Journal of Crystal Growth, 267 (2004): pp. 1-7.*

Kim et al., "Two-step growth of high quality GaN using V/III ratio variation in the intial growth stage", Journal of Crystal Growth (2004): pp. 7-13.*

Office Action for Korean Application No. KR 10-2010-0016034 dated Jul. 18, 2011, 8 pages (no English translation available).

KIPO Search Report (machine translation) Jul. 2011.

Pakula et al., "Reduction of Dislocation Density in Heteroepitaxial GaN: Role of SiH4 Treatment," J. of Crystal Growth, 267 (2007): pp. 1-7.

Jung, "Nano-Structured InGaN Light-Emitting Diodes for Solid-State Lighting" (2009): Chapter 4, pp. 45-46, also see pp. 1-121.

U.S. Appl. No. 13/019,146, Office Action mailed Apr. 3, 2012.

Jung, "Novel Epitaxial Nanostructures for the Improvement of InGaN LEDs Efficiency" IEEE Journal of Selected Topics in Quantum Electronics. vol. 15. No. 4 Jul./Aug. 2009.

Kappers, "Threading dislocation reduction in (0001) GaN thin films using SiN interlayers" Journal of Crystal Growth, 300, (2007): pp. 70-74.

Sheu, "GaN-Based LEDs Output Power Improved by Textured GaN/Sapphire Interface Using In Situ SiH4 Treatment Process During Epitaxial Growth" IEEE Journal of Selected Topics in Quantum Electronics. vol. 15. No. 4. Jul./Aug. 2009.

Yu, "Fabrication and optical properties of nano-structured semipolar InGaN/GaN quantum wells on c-plane GaN template" Phys. Stat. sol. © 5, No. 6, 1618-1620 (2008)/D01 10.1002/pssc.200778541.

European Application No. 11739980.8, Search Report dated Jun. 21, 2013.

Japanese Application No. 2012-551912, Office Action dated Nov. 19, 2013 (no English translation available; best available).

Chinese Application No. 2011-80008490.4, Office Action dated Jul. 3, 2014.

* cited by examiner

METHOD FOR MANUFACTURING GALLIUM NITRIDE WAFER

CROSS-REFERENCE TO RELATED APPLICATIONS

The present application is a divisional and claims the priority benefit of U.S. patent application Ser. No. 13/019,146 filed Feb. 1, 2011, now U.S. Pat. No. 8,354,289 which claims the priority benefit of Korean patent application number 10-2010-0016034 filed Feb. 23, 2010 and Korean patent application number 10-2010-0010319 filed Feb. 4, 2010, which are incorporated herein by reference.

BACKGROUND OF THE INVENTION

1. Field of the Invention

The present disclosure relates to a method for manufacturing a gallium nitride wafer.

2. Description of the Related Art

A light emitting device (LED), which is a p-n junction diode having a characteristic of converting electrical energy into light energy, may be formed by compounding elements of a group III and a group IV in the periodic table. It is possible for a LED to achieve a variety of colors by adjusting compositional ratios of compound semiconductors.

Because of high thermal stability and wide bandgap energy, nitride semiconductors have been received great attentions in developing optical devices and high power density electronic devices. Particularly, blue, green and ultra violet (UV) light emitting devices or the like using nitride semiconductors are commercialized and being widely used.

According to typical technologies an ex-situ method using patterning or an in-situ method using a hydrochloric (HCl) gas is employed in order to grow a high-quality nitride semiconductor.

First, the ex-situ method through patterning includes an epitaxial lateral overgrowth (ELO) method and a pendeo epitaxy (PE) method or the like.

For example, in the ELO method, after growing a gallium nitride (GaN) thin film, a wafer on which the GaN thin film was grown is taken out from a reactor, and then put into a deposition equipment to form a silicon dioxide ($SiO_2$) thin film on the GaN thin film. Thereafter, the wafer where the $SiO_2$ thin film is deposited is taken out from the deposition equipment, and then a $SiO_2$ mask pattern is formed using a photolithographic technique, and the GaN thin film is formed by putting the wafer back into the reactor.

Also, the PE method is also called as a maskless ELO method, and in the PE method, after growing GaN, a substrate is patterned by dry etching up to the substrate. If GaN is grown thereon again, GaN will not grow on the exposed substrate and a growth of GaN on the GaN will be predominant so that a high-quality GaN thin film can be obtained.

However, in the case of ELO, treading dislocations (TD) are propagated up to a top portion of a region without the mask pattern, which still causes the quality to be deteriorated. Also, manufacturing methods of ELO and PE according to a typical technology has disadvantages that complicated processes described above should be undergone and process time is also taken longer.

Meanwhile, in an etching method that uses an HCl gas to improve crystallinity of a GaN wafer, etch pits having an inverse pyramidal shape are formed by etching a dislocation region, and then a method of regrowing a nitride layer thereon is performed in-situ. However, HCl has less etching effect on a specific plane, for example {0001} plane, and has a disadvantage that the controlling of an etch shape and an etch density is difficult because an etching is done mainly on the region where dislocations are distributed.

SUMMARY OF THE CLAIMED INVENTION

Embodiments provide a method for manufacturing a gallium nitride (GaN) wafer which can easily control an etch shape and an etch density or the like.

Embodiments also provide a method for manufacturing a GaN wafer which can improve crystallinity.

In one embodiment, a method for manufacturing a GaN wafer includes: forming an etch stop layer on a substrate; forming a first GaN layer on the etch stop layer; etching a portion of the first GaN layer with a silane gas; forming a second GaN layer on the etched first GaN layer; and forming a third GaN layer on the second GaN layer.

In another embodiment, a method for manufacturing a GaN wafer includes: forming an etch stop layer on a substrate; forming a first GaN layer on the etch stop layer; etching a portion of the first GaN layer with a silane gas to form a concave portion having a predetermined angle; and forming a second GaN layer on the etched first GaN layer.

In further another embodiment, a method for manufacturing a GaN wafer, the method includes: forming a first GaN layer on a substrate; etching a portion of the first GaN layer with a silane gas; forming a second GaN layer to include voids on the etched first GaN layer; and forming a third GaN layer on the second GaN layer.

In still further another embodiment, a method for manufacturing a GaN wafer includes: forming a first GaN layer on a substrate; etching a portion of the first GaN layer with a silane gas; and forming a second GaN layer to include a pyramidal-shaped profile on the etched first GaN layer.

The details of one or more embodiments are set forth in the accompanying drawings and the description below. Other features will be apparent from the description and drawings, and from the claims.

By a method for manufacturing a GaN wafer according to an embodiment, an in-situ etching is made possible using silane and simultaneously, an etch shape and an etch density or the like can be easily controlled by adjusting etch time and flow rates of mixed gases, for example hydrogen ($H_2$), silane and the like.

Also, according to an embodiment, a damage layer is formed by an etching using silane, and a GaN layer is formed to include voids on the damage layer, thereby enabling to improve crystallinity.

Also, according to an embodiment, by a vertical etching method of a GaN layer using a silane gas, voids having uniformity and high density can be easily formed in the GaN layer, and such voids can provide an effect of luminance enhancement when being implemented in a light emitting device.

Also, according to an embodiment, since voids may be formed uniformly in an entire region of a GaN layer, self split may be easily performed using the voids such that a thick film GaN wafer can be easily manufactured.

Also, according to an embodiment, pyramidal shapes are formed on a surface using silane, and crystallinity can be improved by regrowth.

DETAILED DESCRIPTION

Figure 1:
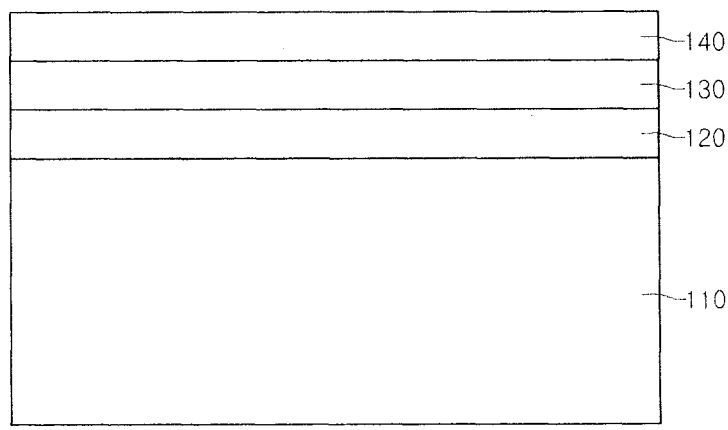
FIGS. 1 to 3 are process cross-sectional views of manufacturing method for a gallium nitride (GaN) wafer and exemplary photographs according to a first embodiment.

In the descriptions of embodiments, it will be understood that when a layer (or film), a region, a pattern, or a structure is referred to as being 'on/over' or 'under' substrate, each layer (or film), a region, a pad, or patterns, it can be directly on or under substrate each layer (or film), the region, the pad, or the patterns, or intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Figure 2:
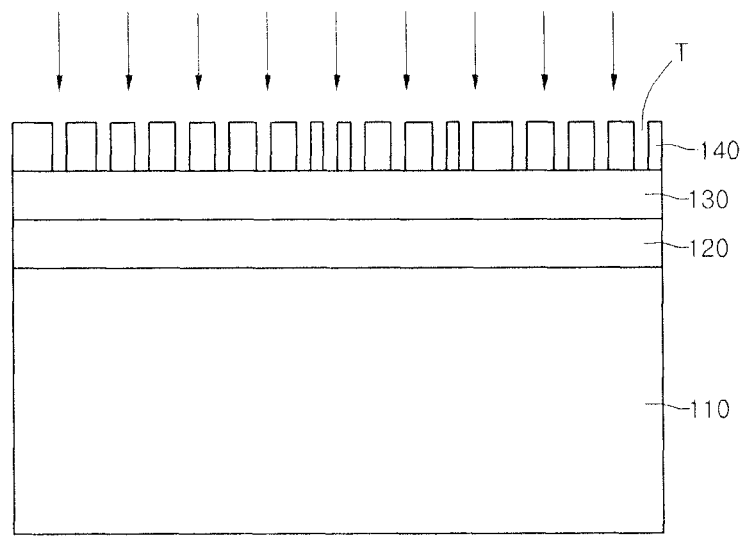
Figure 3:
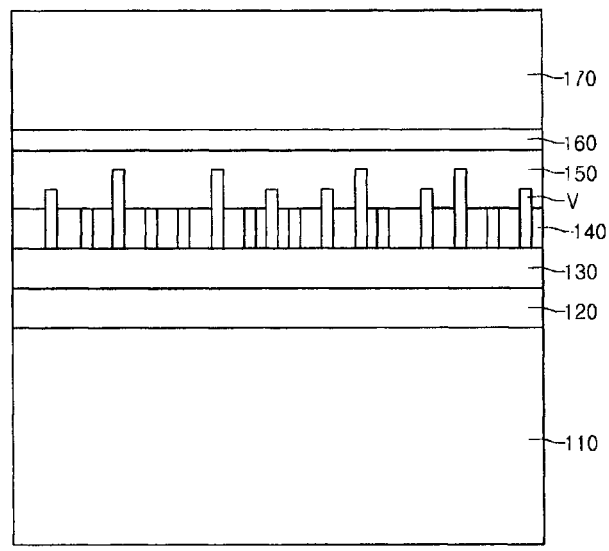

FIGS. 1 to 3 are process cross-sectional views of manufacturing method of a gallium nitride (GaN) wafer and exemplary photographs according to a first embodiment.

A method for manufacturing a GaN wafer according to the first embodiment may include: forming an etch stop layer 130 on a substrate 110; forming a first GaN layer 140 on the etch stop layer 130; etching a portion of the first GaN layer 140 with a silane gas; forming a second GaN layer 150 to include voids V on the etched first GaN layer 140; and forming a third GaN layer 160 on the second GaN layer 150.

The first embodiment can provide a method for manufacturing a gallium nitride (GaN) wafer which can easily control an etch shape and an etch density or the like, and also provides a method for manufacturing a GaN wafer which can improve crystallinity.

For this purpose, by a method for manufacturing a GaN wafer according to the first embodiment, an in-situ etching can be made possible using silane and simultaneously, an etch shape and an etch density or the like can be easily controlled by adjusting etching time and flow rates of mixed gases, for example hydrogen ($H_2$), silane and the like. Also, a damage layer is formed by an etching using silane, and a GaN layer is formed to include voids on the damage layer, thereby enabling to improve crystallinity.

Hereinafter, a method for manufacturing a GaN wafer according to the first embodiment will be described with reference to FIGS. 1 to 3.

First, an etch stop layer 130 may be formed on a substrate 110. The substrate 110 may include a sapphire ($Al_2O_3$) substrate, a silicon carbide (SiC) substrate, a gallium arsenide (GaAs) substrate, a silicon (Si) substrate and the like, but is not limited thereto.

In an embodiment, a buffer layer 120 may be formed on the substrate 110, but is not limited thereto.

Thereafter, an etch stop layer 130 may be formed on the substrate 110 or the buffer layer 120.

The etch stop layer 130 may include an amorphous layer, and the etch stop layer 130 may perform a function of an etch stop layer for selectively etching a first GaN layer 140 which will be formed thereafter. For example, the etch stop layer 130 may include at least one of low-temperature (LT) aluminum nitride (AlN) or silicon nitride (SiN).

The LT AlN may be formed at a temperature of less than about 900.quadrature. For example, the LT AlN may be formed into an amorphous layer at a temperature of about 500 to about 600.quadrature., but the temperature is not limited thereto.

The SIN may be formed into an amorphous layer at a temperature of about 600 to about 1200.quadrature., but is not limited thereto.

Thereafter, a first GaN layer 140 may be formed on the etch stop layer 130.

For example, the first GaN layer 140 may be formed using a method such as chemical vapor deposition (CVD) or molecular beam epitaxy (MBE) or sputtering or hydride vapor phase epitaxy (HYPE), etc.

For example, the first GaN layer 140 may be formed using a trimethyl gallium (TMGa) gas, an ammonia ($NH_3$) gas and the like in a chamber, but is not limited thereto.

Subsequently, as illustrated in FIG. 2, a portion of the first GaN layer 140 may be etched using a silane gas. This etching process may be performed in-situ with the forming process of the GaN layer 140.

The silane gas may have a chemical formula of $Si_nH_{2n+2}$, and may be mono-silane, di-silane, tri-silane, tetra-silane and the like, but is not limited thereto.

In an embodiment, since a portion of the GaN layer 140 may be etched with the silane gas, a portion of the etch stop layer may be exposed, and trenches T may be formed in the etched first GaN layer.

For example, trenches, which have a profile vertical to the etched GaN layer 140 or close to the vertical profile, may be formed.

In an embodiment, the trenches T may include a concave portion having a shape in which widths of top and bottom are the same as illustrated in FIG. 2 as well as a concave portion in which widths of top and bottom are different.

According to first embodiment, in the case where a portion of the first GaN layer 140 may be etched using a silane gas, trenches which are formed more close to a vertical profile cab be obtained.

In an embodiment, when a portion of the first GaN layer 140 may be selectively etched, an etching process may be performed without an etching mask. For example, in an embodiment, during the etching of the GaN layer 140 with a silane gas, a trench shape may also be formed without an etching mask such as SiN or the like. The structure of GaN may be a Wurtzite crystal structure in which an anisotropy will exist between an a-axis and a c-axis during the performing of an etching, and therefore, trenches may be formed without an etching mask in the case where a deep etching may be performed in the c-axis until reaching the etch stop layer 130 when etching time is long.

In the case of a typical etching technology using HCl, a degree of dependence on a crystal orientation is high and an etching on a defect portion, for example, a region with dislocations is mainly done such that formation of a uniform concave portion is difficult, and furthermore, a trench-shaped concave portion having a vertical profile is not able to be formed.

For example, in the case of a typical etching technology using HCl, an etching is mainly done on a {11-21} plane or a {1-102} plane, and an etching on a {0001} plane hardly occurs. Also, in the case of a typical etching technology using HCl, since an etching is mainly done on a region having dislocations or the like, concave portions having pyramidal shapes with nonuniform distribution may be formed, but pyramidal-shaped concave portions with uniform distribution may not be formed.

Also, in the case of a typical etching technology using HCl, an etch stop point is controlled by time in many cases such that damage is done on a substrate or the like. On the other hand, in the case of etching a portion of a GaN layer with a silane gas in an embodiment, the etching is performed on the GaN layer, and the etching is not performed on the substrate or the like by the etch stop layer such that a stable process is possible.

In the etching of a portion of the first GaN layer 140 with the silane gas in an embodiment, $H_2$ and $N_2$ may be used as carrier gases, and $NH_3$ may be excluded during an etching process using a silane gas different from a typical technology.

In an embodiment, regarding to a relative ratio between a silane gas and a hydrogen ($H_2$) gas, an etching with an irregular profile rather than a vertical profile may be performed when increasing a ratio of $H_2$ gas.

Also, in an embodiment, etch time may range from about 5 minutes to about 30 minutes in the etching of a portion of the first GaN layer 140 with the silane gas, and a vertical trench profile may be formed during about 10 minutes of an etching process, but is not limited thereto.

Also, in the etching of a portion of the first GaN layer 140 with the silane gas, when the silane gas is di-silane ($Si_2H_6$), the di-silane may be in the range of about 0.01 .mu.mol to about 1 .mu.mol, and an etching with a vertical profile may not be performed when the di-silane is about 0.01 .mu.mol or less, and an excessive etching may be performed when the di-silane is about 1 .mu.mol or more.

Also, in the etching of a portion of the first GaN layer 140 with the silane gas in an embodiment, an etching may be performed at a temperature of about 800 to about 1200, but is not limited thereto.

Meanwhile, in the etching of a portion of the first GaN layer 140 with the silane gas in an embodiment, an etching process may also be performed using a silicon nitride ($Si_xN_y$) random mask (not shown).

For example, before the etching with a silane gas, the $Si_xN_y$, random mask is formed during about 30 seconds to about 5 minutes of a process by mixing a di-silane ($Si_2H_6$) and an ammonia ($NH_3$) gas, and then if an etching process is performed, trenches may be formed by etching a portion without the random mask.

Subsequently, as illustrated in FIG. 3, a second GaN layer 150 is formed on the etched first GaN layer 140 to form the second GaN layer 150 including voids V. Thereafter, a third GaN layer 160 and a fourth GaN Layer 170 or the like may be formed on the second GaN layer 150.

According to an embodiment, a void is formed at a lower portion of a trench having a deep depth and a lateral growth occurs on a surface of a GaN layer to block an entrance of the etched trench such that a void may be easily formed in an in-situ state. Therefore, a GaN wafer, which includes voids having high uniformity as well as high generation density, may be obtained.

According to an embodiment, by a vertical etching method of a GaN layer using a silane gas, voids having uniformity and high density can be easily formed in the GaN layer, and positions of voids can be controlled and multi-voids can be formed such that there is an effect of luminance enhancement when being implemented in a light emitting device.

Also, according to an embodiment, since voids may be formed uniformly in an entire region of a GaN layer, self split may be easily performed using the voids. That is, according to an embodiment, if an etching with a silane gas is applied to a damage layer, a thick film may be formed without subsequent processes such as a chemical etching and a laser lift off (LLO) process. Large diameter manufacturing as well as yield improvement is possible if a thick film GaN wafer is manufactured using the foregoing. Also, a silane gas etching is possible for an in-situ process such that there is an advantage in which a high-quality thick film GaN wafer can be made at no additional cost and in a short period of time.

For example, the second GaN layer 150 may be formed by a first growing with a high V/III ratio. For example, the second GaN layer 150 including voids V may be formed using TMG and $NH_3$ gases at a temperature of more than about 1000 and a pressure of less than about 200 mbar, but is not limited thereto, and the pressure may be more than about 200 mbar.

Thereafter, the third GaN layer 160 may be formed by a second growing with a low V/III ratio. For example, the third GaN layer 160 may be formed using TMG and $NH_3$ gases at a temperature of more than about 1000 and a pressure of less than about 200 mbar, but is not limited thereto, and the pressure may be more than about 200 mbar.

Subsequently, the high-quality fourth GaN layer 170 may be formed by a third growing with a normal V/III ratio.

For example, the high-quality fourth GaN layer 170 may be formed using TMG and $NH_3$ gases at a temperature of more than about 1000.

According to the first embodiment, a GaN wafer including voids V can be obtained.

Thereafter, a high-quality GaN wafer may be completed by removing the substrate 110 with a laser lift-off process or a mechanical grinding.

By a method for manufacturing a GaN wafer according to an embodiment, an in-situ etching is made possible using silane and simultaneously, an etch shape and an etch density or the like can be easily controlled by adjusting etch time and flow rates of mixed gases, for example hydrogen ($H_2$), silane and the like.

Also, according to an embodiment, a damage layer is formed by an etching using silane, and a GaN layer is formed to include voids on the damage layer, thereby enabling to improve crystallinity.

Figure 4:
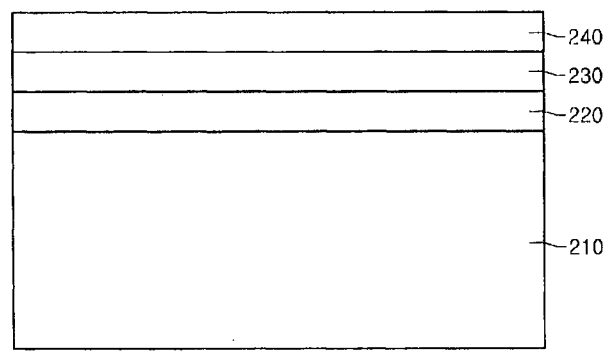
FIGS. 4 to 6 are process cross-sectional views of manufacturing method of a GaN wafer and exemplary photographs according to a second embodiment.
Figure 5:
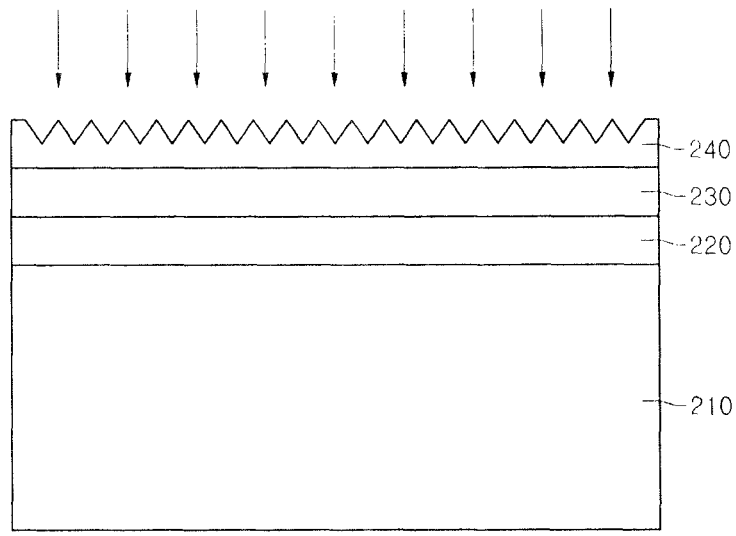
Figure 6:
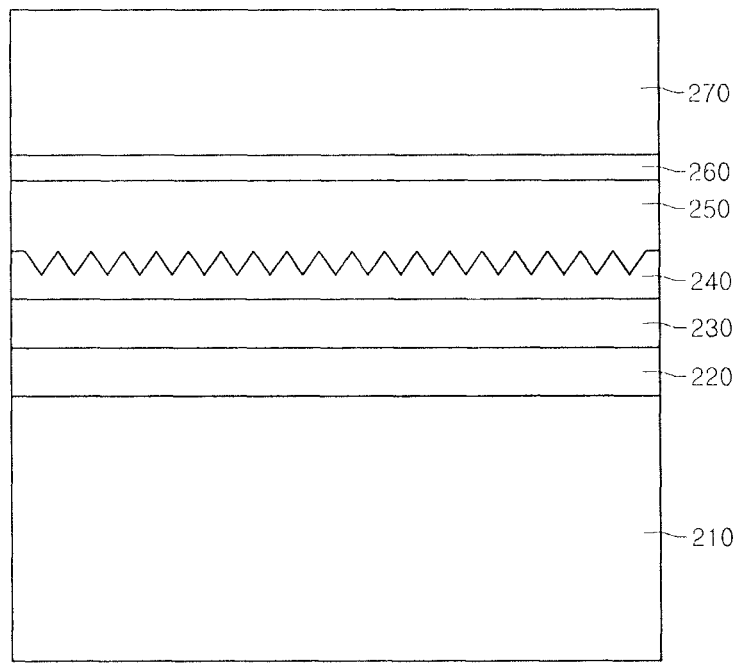

FIGS. 4 to 6 are process cross-sectional views of manufacturing method of a GaN wafer and exemplary photographs according to a second embodiment.

The second embodiment may adopt technical characteristics of the first embodiment.

In the second embodiment, a GaN wafer may be manufactured to include a pyramidal-shaped profile between a first GaN layer 240 and a second GaN layer 250.

A method for manufacturing a GaN wafer according to the second embodiment may include forming a first GaN layer 240 on a substrate 210, etching a portion of the first GaN layer 240 with a silane gas, and forming a second GaN layer 250 on the etched first GaN layer 240.

First, as illustrated in FIG. 4, a buffer layer 220 and an etch stop layer 230 may be formed on the substrate 210, but is not limited thereto.

The substrate 210 may be chosen from a sapphire ($Al_2O_3$) substrate, a silicon carbide (SiC) substrate, a gallium arsenide (GaAs) substrate, a silicon (Si) substrate and the like, but is not limited thereto.

The etch stop layer 230 may include an amorphous layer, and the etch stop layer 230 may perform a function of an etch stop layer for selectively etching the first GaN layer 240 which will be formed thereafter. For example, the etch stop layer 230 may include at least one of low-temperature (LT) aluminum nitride (AlN) or silicon nitride (SiN).

Subsequently, the first GaN layer 240 is formed on the substrate 210 or the etch stop layer 230.

For example, the first GaN layer 240 may be formed using a method such as chemical vapor deposition (CVD) or molecular beam epitaxy (MBE) or sputtering or hydride vapor phase epitaxy (HVPE), etc.

Subsequently, as illustrated in FIG. 5, a portion of the first GaN layer 240 is etched using a silane gas. This etching process may be performed in-situ with the forming process of the first GaN layer 240.

In the etching of a portion of the first GaN layer 240 using the silane gas, an etching process may be performed without an etching mask.

Also, in the etching of a portion of the first GaN layer 240 using the silane gas, a concave portion having a predetermined angle may be formed in the etched first GaN layer 240.

For example, a pyramidal-shaped damage region may be formed in the etched first GaN layer 240.

An epitaxial lateral overgrowth (ELO) process according to a typical technology is a method of bending dislocations by regrowth in a region opened through patterning after the forming of silicon nitride (SiN) or silicon dioxide (SiO$_2$). In the ELO process, a pyramidal shape is formed by depending on a regrowth condition, and in an embodiment, the pyramidal shape can be uniformly and easily determined by depending on an etching condition.

Also, in the case of etching GaN using HCl in a typical etching technology, since an etching effect on a {0001} plane is small and an etching is mainly done on a {11-21} or {1-102} plane as described in the foregoing, there are limitations that the etching is not done on a normally grown plane but is mainly done on dislocation positions.

Also, in the case of etching GaN using HCl in a typical etching technology, there is a limitation that an etched angle by a reaction plane is formed in the range of about 40-60 degrees. However, according to an embodiment, an etching is not depend on a crystal plane but is done in a wide range when using a silane gas. Therefore, an etching ratio and a pyramidal shape may be easily controlled using flow rates of a silane gas and a mixed gas.

According to the second embodiment, when a portion of the first GaN layer 240 is etched using a silane gas, a pyramidal-shaped damage region can be formed on the first GaN layer 240.

In the etching of a portion of the first GaN layer 240 by the silane gas, the silane gas has a chemical formula of $Si_nH_{2n+2}$, and may be mono-silane, di-silane, tri-silane, tetra-silane and the like, but is not limited thereto.

In an embodiment, in the etching of a portion of the first GaN layer 240 with the silane gas, $H_2$ and $N_2$ may be used as carrier gases, and $NH_3$ may be excluded during an etching process using the silane gas.

In the etching of a portion of the first GaN layer 240 with the silane gas, etch time may range from about 3 minutes to about 10 minutes, and for example, a pyramidal shape with an angle close to about 60 degrees is observed when an etching process is performed during about 5 minutes, but the etch time is not limited thereto.

In the etching of a portion of the first GaN layer 240 with the silane gas, when the silane gas is di-silane ($Si_2H_6$), the di-silane may be in the range of about 0.01 .mu.mol to about 1 .mu.mol and an etching with a pyramidal shape may not be performed when the di-silane is about 0.01 .mu.mol or less, and an excessive etching may be performed when the di-silane is about 1 .mu.mol or more.

In the etching of a portion of the first GaN layer 240 with the silane gas, an etching may be performed at a temperature of about 800.quadrature. to about 1200.quadrature., but is not limited thereto.

Subsequently, as illustrated in FIG. 6, the second GaN layer 250 may be formed on the first GaN layer 240.

In the forming of the second GaN layer 250 on the etched first GaN layer 240, the second GaN layer 250 may be formed to include a pyramidal-shaped profile between the first GaN layer 240 and the second GaN layer 250.

Thereafter, a third GaN layer 260 and a fourth GaN layer 270 or the like may be formed on the second GaN layer 250.

For example, the second GaN layer 250 may be formed by a first growing with a high V/III ratio (about 5000-110000).

For example, the second GaN layer 250 may be formed to include a pyramidal-shaped profile between the first GaN layer 240 and the second GaN layer 250 using TMG and $NH_3$ gases at a temperature of more than about 1000 and a pressure of less than about 200 mbar.

Thereafter, the third GaN layer 260 may be formed by a second growing with a low V/III ratio (about 300-1300). For example, the third GaN layer 260 may be formed using TMG and $NH_3$ gases at a temperature of more than about 1000 and a pressure of less than about 200 mbar, but is not limited thereto, and the pressure may be more than about 200 mbar.

Subsequently, the high-quality fourth GaN layer 270 may be formed by a third growing with a normal V/III ratio (about 1300-2500).

For example, the high-quality fourth GaN layer 270 may be formed using TMG and $NH_3$ gases at a temperature of more than about 1000.

Meanwhile, in the second embodiment, processes for the second GaN layer 250 and third GaN layer 260 are omitted and the fourth GaN layer 270 is formed such that a GaN layer may be formed to include a pyramidal-shaped profile between the first GaN layer 240 and the fourth GaN layer 270.

Also, in the second embodiment, when performing by including the processes for the second GaN layer 250 and the third GaN layer 260, process time may be more reduced than the first embodiment.

According to the second embodiment, a GaN wafer including pyramidal-shaped profiles can be obtained.

Thereafter, a high-quality GaN wafer may be completed by removing the substrate 210 with a laser lift-off process or a mechanical grinding.

By a method for manufacturing a GaN wafer according to an embodiment, an in-situ etching is made possible using silane and simultaneously, an etch shape and an etch density or the like can be easily controlled by adjusting etch time and flow rates of mixed gases, for example hydrogen ($H_2$), silane and the like.

Also, according to an embodiment, uniform pyramidal shapes are formed on an entire surface using silane, and crystallinity can be improved by regrowth.

The aforesaid embodiments may be applied to GaN, for example to a method for manufacturing a GaN wafer, but is not limited thereto.

By a method for manufacturing a GaN wafer according to an embodiment, an in-situ etching is made possible using silane and simultaneously, an etch shape and an etch density or the like can be easily controlled by adjusting etch time and flow rates of mixed gases, for example hydrogen ($H_2$), silane and the like.

Also, according to the embodiment, a damage layer is formed through an etching using silane, and a GaN layer is formed to include voids on the damage layer, thereby enabling to improve crystallinity.

Features, structures, effects described above are included in at least one of the embodiments, but not limited to only one embodiment. Moreover, features, structures, effects exemplified in the respective embodiments may be modified into or combined with other embodiments by a person having ordinary skill in the art to which the embodiments pertain.

Accordingly, details about the combination and modification should be construed as being included in the scope of the embodiment.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a gallium nitride (GaN) wafer, the method comprising:
    forming an etch stop layer on a substrate;
    forming a first GaN layer on the etch stop layer;
    etching a portion of the first GaN layer with a silane gas to form trenches; forming a second GaN layer on the etched first GaN layer including voids, the voids of the second GaN layer extending from one or more of the trenches of the first GaN layer; and
    forming a third GaN layer on the second GaN layer, wherein during the etching of the portion of the first GaN layer with the silane gas, the etching process is performed using a silicon nitride ($Si_xN_y$) random mask.

2. The method of claim 1, wherein the etching the portion of the first GaN layer is performed until the etch stop layer is exposed.

3. The method of claim 1, wherein the etching the portion of the first GaN layer is performed in a vertical shape.

4. The method of claim 1, wherein the voids are formed at a bottom surface of the second GaN layer.

5. The method of claim 1, wherein the voids have different height.

6. A method for manufacturing a GaN wafer, the method comprising:
    forming an etch stop layer on a substrate;
    forming a first GaN layer on the etch stop layer;
    etching a portion of the first GaN layer with a silane gas to form a concave portion having a predetermined angle;
    forming a second GaN layer on the etched first GaN layer and having a bottom surface and a top surface, the bottom surface of the second GaN layer including a convex portion and the top surface of the GaN layer having a flat surface, the convex portion of the second GaN layer contacting the concave portion of the first GaN layer and having a shape corresponding to a shape of the concave portion of the first GaN layer; and
    forming a third GaN layer contacting the top surface of the second GaN layer, wherein a N/Ga ratio of the third GaN layer is lower than a N/Ga ratio of the second GaN layer.

7. The method of claim 6, wherein during the etching of the portion of the first GaN layer with the silane gas the etching process is performed without an etching mask.

8. The method of claim 6, wherein a pyramidal-shaped damage region is formed in the etched first GaN layer.

9. The method of claim 8, wherein, in the forming of the second GaN layer on the etched first GaN layer, the second GaN layer is formed to include a pyramidal-shaped profile between the first GaN layer and the second GaN layer.

* * * * *